(12) United States Patent
Surendranath et al.

(10) Patent No.: US 11,152,903 B2
(45) Date of Patent: Oct. 19, 2021

(54) GROUND NOISE SUPPRESSION ON A PRINTED CIRCUIT BOARD

(71) Applicant: Texas Instruments Incorporated, Dallas, TX (US)

(72) Inventors: Nagesh Surendranath, Plano, TX (US); Shriram Mahendra Devi, Maharashtra (IN); Sravana Kumar Goli, Bangalore (IN)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 16/660,302

(22) Filed: Oct. 22, 2019

(65) Prior Publication Data

US 2021/0119594 A1    Apr. 22, 2021

(51) Int. Cl.
*H03F 3/45*    (2006.01)

(52) U.S. Cl.
CPC ... *H03F 3/45475* (2013.01); *H03F 2200/129* (2013.01); *H03F 2200/171* (2013.01); *H03F 2200/372* (2013.01); *H03F 2203/45116* (2013.01); *H03F 2203/45512* (2013.01)

(58) Field of Classification Search
CPC ........................................................ H03F 3/45
USPC ........................................ 330/252, 260, 261
See application file for complete search history.

(56) References Cited

U.S. PATENT DOCUMENTS

| | | | |
|---|---|---|---|
| 4,649,461 A | 3/1987 | Matsuta | |
| 5,121,075 A * | 6/1992 | Roach | H03G 3/001 |
| | | | 330/126 |
| 5,218,760 A | 6/1993 | Colton et al. | |
| 8,134,084 B2 | 3/2012 | Kawaguchi et al. | |
| 8,525,287 B2 | 9/2013 | Tian et al. | |
| 8,633,757 B1 | 1/2014 | An et al. | |
| 2013/0250150 A1 | 9/2013 | Malone et al. | |

* cited by examiner

*Primary Examiner* — Henry Choe
(74) *Attorney, Agent, or Firm* — Ray A. King; Charles A. Brill; Frank D. Cimino

(57) ABSTRACT

In accordance with one embodiment, an apparatus includes a first amplifier having a noninverting input, an inverting input and an output. The noninverting input is coupled to a first ground reference. The inverting input is coupled to an output of an external sensor. The apparatus also includes a second amplifier having a noninverting input, an inverting input and an output. The noninverting input is coupled to the first ground reference. The inverting input is coupled to the power supply through a first variable capacitor and to the second ground reference through a second variable capacitor. The output is coupled to the inverting input of the first amplifier. The external sensor is coupled to a third ground reference, and the first amplifier and second amplifier are coupled to the second ground reference.

19 Claims, 3 Drawing Sheets

GROUND NOISE SUPPRESSION ON A PRINTED CIRCUIT BOARD

BACKGROUND

A Read Out Integrated Circuit (ROIC) device is used for reading detectors and is compatible with different types of detectors such as those that sense radiation in visible wavelengths (0.35-1.050, Near Infrared (0.9-1.8μ), Short Wave Infrared (0.9-2.5μ), Medium Wave Infrared (0.9-5.0μ) and Long Wave Infrared (0.9-beyond 16μ) wavelengths. X-ray detectors typically operate in the wavelength range from 0.1 nm to 10 nm.

One purpose for ROICs is to accumulate photocurrent from each detector photodiode pixel, then transfer the resultant signal to output nodes for readout. Conventional ROIC technology amplifies the signal charge from each pixel, then routes the signals to the output nodes for readout. This requires integrating signal charge from each pixel site and maintaining a good signal-to-noise ratio as the signal is read out and digitized.

The sensor output that is fed to the ROIC is single-ended and has small amplitude, so it can be sensitive to noise. Therefore, reducing ground noise is one important design considerations in x-ray systems.

SUMMARY

This Summary is provided to introduce the disclosed concepts in a simplified form that are further described below in the Detailed Description including the drawings provided. This Summary is not intended to limit the claimed subject matter's scope.

In accordance with one embodiment, an apparatus includes a first amplifier having a noninverting input, an inverting input and an output. The noninverting input is coupled to a first ground reference. The inverting input is coupled to an output of an external sensor.

The apparatus also includes a second amplifier having a noninverting input, an inverting input and an output. The noninverting input is coupled to the first ground reference. The inverting input is coupled to the power supply through a first variable capacitor, and to the second ground reference through a second variable capacitor. The output is coupled to the inverting input of the first amplifier. The external sensor is coupled to a third ground reference, and the first amplifier and second amplifier are coupled to the second ground reference.

A second embodiment includes a first amplifier having a noninverting input, an inverting input and an output. The noninverting input is coupled to a first ground reference. The inverting input is coupled to a power supply through a first variable capacitor and is coupled to a second ground reference through a second variable capacitor. The output of the first amplifier is coupled to the inverting input of a second amplifier. The output of the first amplifier is opposite in polarity and has approximately equal amplitude to the sum of noise capacitively coupled from the second ground reference and noise capacitively coupled from the power supply to the second amplifier.

A third embodiment is a method for mitigating noise comprising coupling a first ground reference to a noninverting input of an amplifier, coupling a power supply to an inverting input of the amplifier through a first variable capacitor. The method further comprises coupling a second ground reference to the inverting input of the amplifier through a second variable capacitor and adjusting the capacitance values of the first variable capacitor and the second variable capacitor to mitigate noise at an electrical node.

Like reference symbols in the various drawings indicate like elements. Details of one or more implementations of the present disclosure are set forth in the accompanying drawings and the description below. The figures are not drawn to scale and they are provided merely to illustrate the disclosure. Specific details, relationships, and methods are set forth to provide an understanding of the disclosure. Other features and advantages may be apparent from the description and drawings, and from the claims.

DETAILED DESCRIPTION

At least one example of an x-ray system may have 12 ROIC's, each with 256 channels. In this example, there would be over 3000 amplifiers in the system, each putting noise on the ground plane. Noise coupled by parasitic capacitance to the amplifier from the ground plane and power supply can be problematic. This noise may corrupt the signal reading from a sensor.

In one example, the input to an amplifier comes from the output of an external sensor, wherein the sensor is referenced to a ground node, QGND. This ground node, QGND, is connected to AGND, which is a ground connection to each ROIC, via a ground plane or a long metal strip that runs the length of the printed circuit board (PCB). However, because of connector impedances, electrical resistance of the ground plane, the number of routing layers in the PCB, and noise from other signals, the voltages at QGND and AGND may be different.

In some examples, the bias current drawn by each ROIC may be 200 mA. If there are twelve ROICs on each board, this produces a considerable amount of bias current. Thermal and shot noise in the bias current is injected onto AGND, increasing the difference in voltage between QGND and AGND. This causes correlated noise in the system, making it more difficult to meet system noise specifications.

Figure 1:
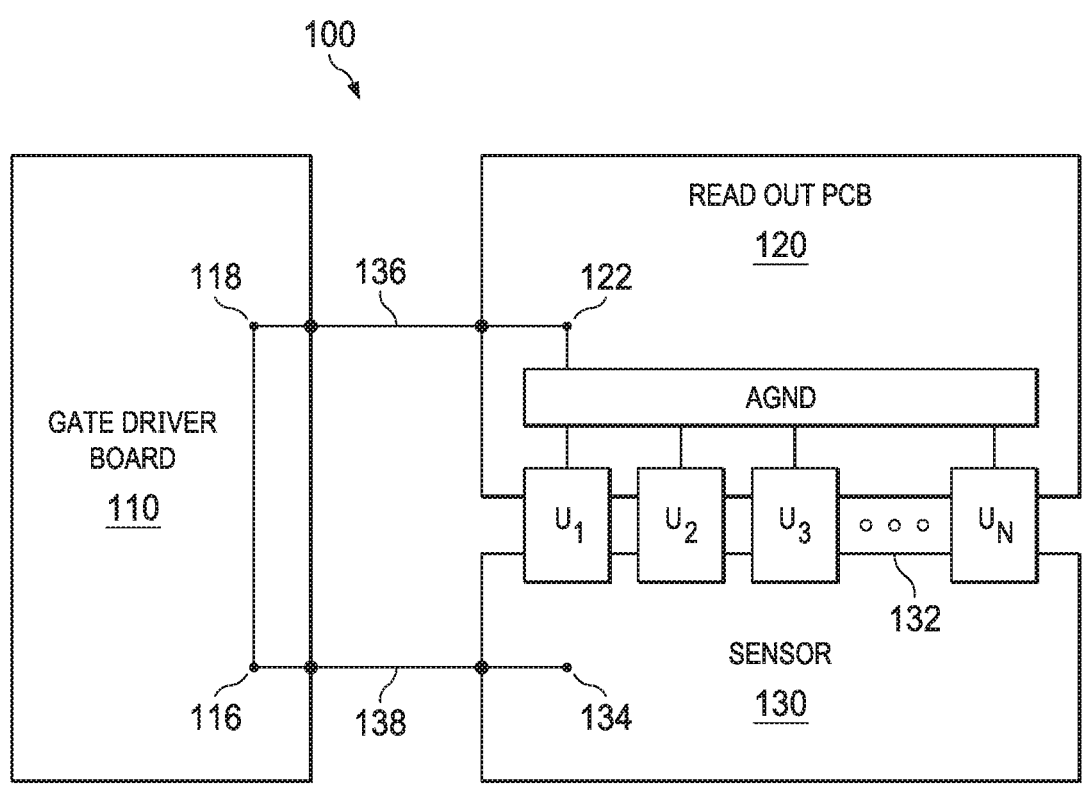
FIG. 1 is a block diagram of a digital x-ray system with a prior art grounding scheme.

Referring to FIG. 1, one example of a digital x-ray system 100 includes a gate driver board 110, a readout PCB 120, and a sensor 130. The gate driver board 110 and the readout PCB 120 are coupled together by a connector 136 which has a finite electrical resistance.

The gate driver board 110 is coupled to the sensor 130 by a connector 138 which also has a finite electrical resistance. In some embodiments, the connector 138 between the gate driver board 110 and the sensor 130 may be a flex connector. A flex connector also has a small electrical resistance.

The readout PCB 120 and the sensor 130 are coupled together through a series of analog front end integrated circuits, collectively 132, labeled as $U_1, U_2, U_3, \ldots U_N$. In one embodiment, there may be 12 analog front end integrated circuits, also called ROICs, in a system, but there could be any number of ROICs in other embodiments. The ROICs may be comprised of programmable gain amplifiers, multiplexers, analog-to-digital converters and a serial data interface. The ROICs 132 may be mounted on a flex assembly that plugs into the readout PCB 120 and the sensor 130.

The gate driver board 110 has a ground reference node, QGND, 116 that is coupled to the sensor 130 through the connector 138 at node 134. The gate driver board 110 has a QGND reference node 118 that is coupled to the readout PCB 120 through the connector 136 at node 122. QGND nodes 116 and 118 are electrically connected together on the gate driver board 110. Because only a small current flows through the gate driver board 110, nodes 116 and 118 have approximately the same voltage.

The readout PCB 120 has its own ground reference, analog ground (AGND), which is a local ground point on the ground plane near each ROIC 132. AGND is coupled at node 122 to QGND node 118 through the connector 136.

In contrast to the gate driver board 110, the readout PCB 120 has relatively large current draw from the power supply. In one embodiment, the bias current drawn by each ROIC 132 may be 200 mA, resulting in a significant amount of current through the readout PCB 120. The thermal and shot noise in the bias current is injected onto the ground reference AGND. Therefore, AGND has a voltage gradient along the readout PCB 120 relative to QGND. The thermal and shot noise on AGND increases incrementally along the length of the ground plane. This means that AGND will be electrically closest to QGND at node 122, then will get progressively noisier moving from $U_1$ to $U_2$, and $U_2$ to $U_3$, making AGND noisiest at its connection to $U_N$.

The ROIC 132 gets its ground reference from AGND through its connection to the readout PCB 120. The ground reference for the sensor 130 is QGND. Therefore, the noise between AGND and QGND finds a path to the sensor output signal through the input load impedance of the ROIC 132.

Another possible solution to improve the system noise performance is to split the grounds of the ROIC into a reference ground (REFGND) that does not carry the bias current of the ROICs and an analog ground (AGND) that carries the large bias current of the ROICs. The REFGND and AGND are then electrically connected to QGND.

Figure 2:
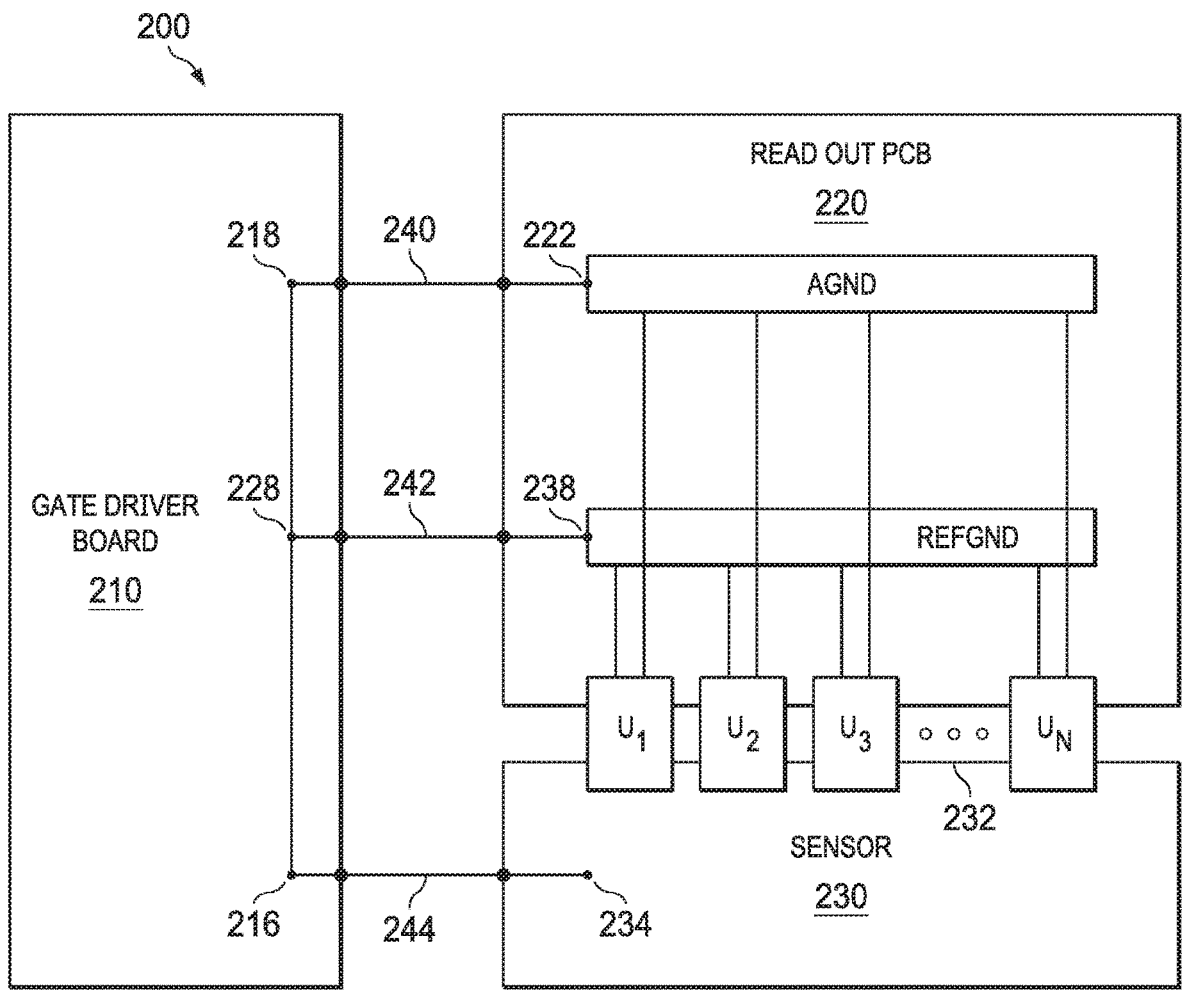
FIG. 2 is a block diagram of a digital x-ray system with a prior art grounding scheme.

Referring to FIG. 2, one embodiment of the system 200 includes a gate driver board 210, a readout PCB 220 and a sensor 230. The gate driver board 210 and the readout PCB 220 are coupled together by connectors 240 and 242 which carry ground reference signals AGND and REFGND, respectively.

The AGND reference comes from node 218 on the gate driver board 210 and is fed through the connector 240 to the readout PCB 220 at node 222. The connection through the connector 240 between node 218 and node 222 has a finite electrical resistance.

The REFGND reference comes from node 228 on the gate driver board 210 and is fed through the connector 242 to the readout PCB 220 at node 238. The connection through the connector 242 between node 228 and node 238 has a finite electrical resistance. The current flowing on REFGND is small, so the voltages at nodes 238 and 228 are approximately the same.

The gate driver board 210 is coupled to the sensor 230 by a connector 244. Node 216 is the QGND reference point on the gate driver board 210 and brings QGND to the sensor 230 through the connector 244 to node 234. The REFGND node 228 is electrically connected to the QGND node 216 on the gate driver board 210. The gate driver board 210 carries almost no current on the ground line, so QGND at node 216 is at virtually the same voltage as REFGND at node 228. Also, there is little current draw from the sensor, making the sensor ground node 234 effectively the same as QGND 216.

In the same manner, AGND at node 218 is electrically connected to QGND at node 228, and they are at virtually the same potential since there is little noise or current on the gate driver board 210. This places nodes 218, 228, 238, 216 and 234 near the same potential. Hence, the ground reference for the gate driver board 210, as well as the sensor 230, can be considered to be QGND.

Unlike the gate driver board 210 and the sensor 230, the readout PCB 220 has large current draw from the power supply. The bias current drawn by each ROIC 232 may be 200 mA, leading to a significant amount of current draw. The thermal and shot noise in the bias current is injected on AGND. AGND has a voltage gradient along the readout PCB 220 relative to REFGND, so that the noise on AGND gets greater the farther the point is physically from the gate driver board 210. This means that AGND will be closest electrically to REFGND at node 222, then will get progressively worse moving from $U_1$ to $U_2$, and $U_2$ to $U_3$, making AGND noisiest at its connection to $U_N$. Each of the ROICs, $U_1, U_2, U_3 \ldots U_N$, collectively 232, receives both AGND and REFGND.

Figure 3:
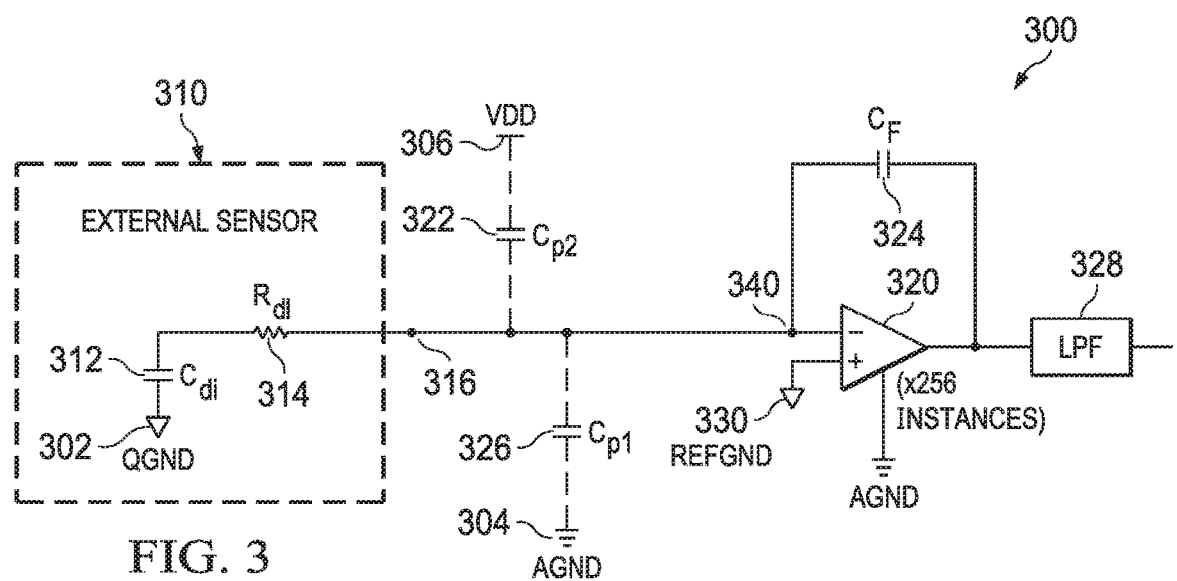
FIG. 3 is a circuit schematic diagram for an embodiment of an analog front end of an x-ray signal processing system.

FIG. 3 illustrates one embodiment of a circuit 300 for the analog front end of an x-ray signal processing system having the grounding scheme described in FIG. 2. A model of the output stage of the sensor 310 having sensor output 316, which represents one line scan of data from the sensor 230 of FIG. 2, is shown. It is capacitively coupled to QGND 302 through a capacitor 312 and has an output 316. The output 316 of the sensor model 310 is coupled to the inverting input of amplifier 320. Amplifier 320 is a charge summing amplifier that integrates charge collected by the sensor 310. Capacitor 324 is connected in the feedback loop between the inverting input and the output of amplifier 320, making amplifier 320 an integrator. The non-inverting input of amplifier 320 is coupled to REFGND 330.

Parasitic capacitance 322 from the power supply 306 couples noise from the power supply into the inverting input 340 of amplifier 320. Likewise, parasitic capacitance 326 can couple noise from AGND into the inverting input 340 of amplifier 320. As a result, adding a ground connection with a separate REFGND 330 on the readout PCB 220 that carries very little current may give some noise improvement.

Figure 4:
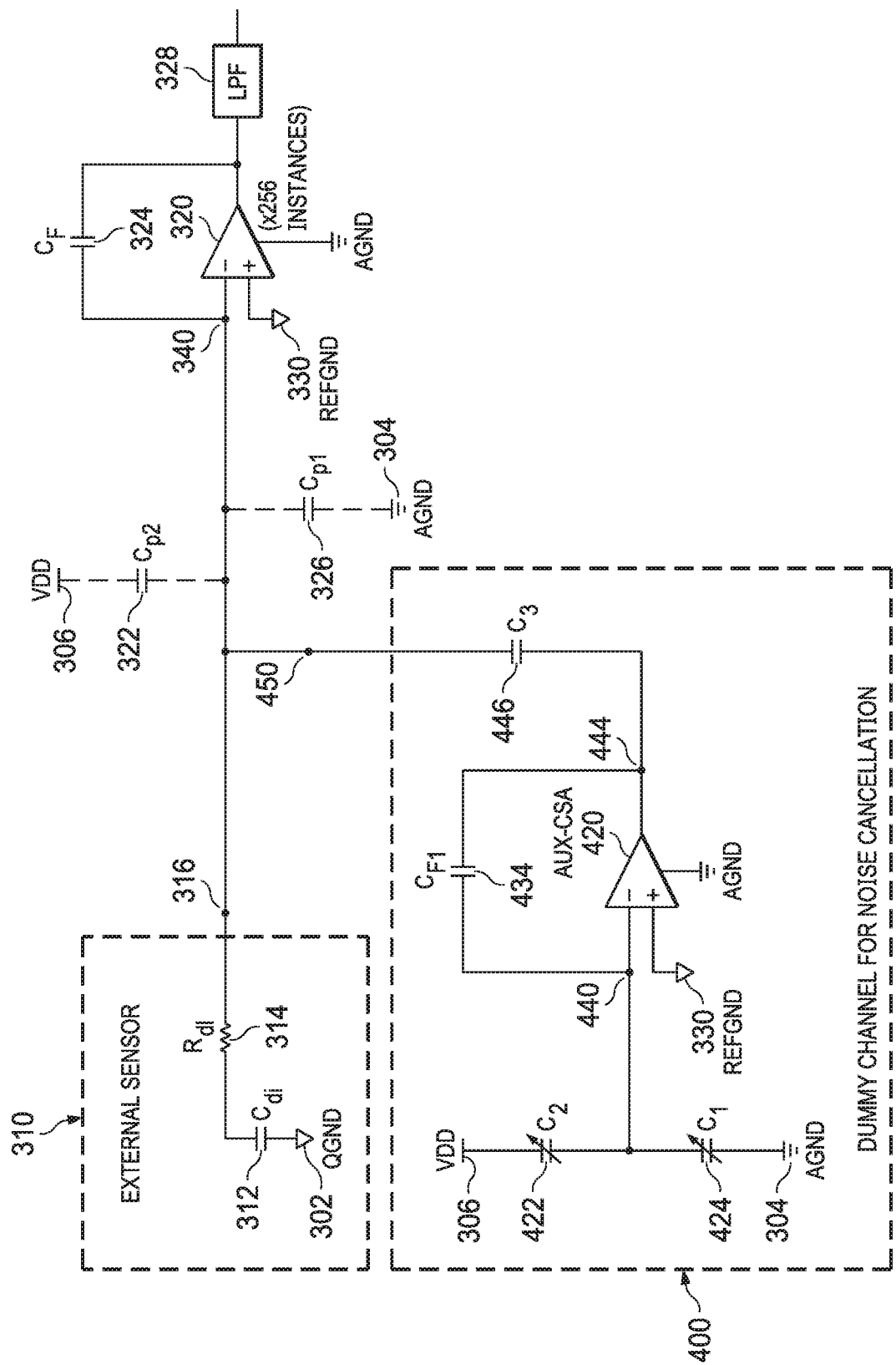
FIG. 4 is a circuit schematic diagram for an analog front end of an x-ray signal processing system with a grounding scheme that includes the addition of a dummy channel for noise mitigation according to one example of the invention.

FIG. 4 shows the circuit of FIG. 3 with one embodiment of additional circuitry to mitigate the noise contribution from the supply voltage and analog ground that is coupled to the input of amplifier 320 through parasitic capacitances 322 and 326. Amplifier 420 is added to create a dummy channel 400 whose output is equal in magnitude and opposite in polarity to the noise contribution from the supply voltage and AGND. Variable capacitors 422 and 424 are provided to adjust the gain of amplifier 420 relative to the supply voltage and AGND respectively in order to obtain a signal whose amplitude closely matches the noise contributions from the supply voltage and AGND, but with opposite phase. The output 450 of the dummy channel 400 is then summed into the input node 340 of the charge summing amplifier 320 to mitigate the noise from the supply voltage and AGND.

The power supply 306 is coupled to one terminal of a variable capacitor 422. The other terminal of the variable capacitor 422 is coupled to the inverting input of amplifier 420. One terminal of a second variable capacitor 424 is also coupled to the inverting input 440 of amplifier 420 and to the second terminal of variable capacitor 422. The other terminal of the second variable capacitor 424 is coupled to AGND. The noise from the power supply 306 and the noise from AGND 304 are summed into the inverting terminal 440 of amplifier 420 through variable capacitors 422 and 424. The non-inverting input of amplifier 420 is coupled to REFGND 330.

One terminal of a feedback capacitor 434 is coupled to the inverting input 440 of amplifier 420. The other terminal of feedback capacitor 434 is coupled to the output 444 of amplifier 420 making amplifier 420 an integrating amplifier. The output 444 of amplifier 420 is coupled to a capacitor 446 to remove any DC component in the signal. The other terminal of capacitor 446 is coupled to node 340, the inverting input of amplifier 320.

The values of variable capacitors 422 and 424 can be adjusted to make the amplitude of the output 450 of the dummy channel 400 that is being fed to node 340 equal to the amplitude, but opposite in phase, to the sum of the noise from the power supply 306 and analog ground 304.

In one embodiment, the values of variable capacitors 422 and 424 may be determined empirically by monitoring the output of amplifier 320 while varying the capacitance values of variable capacitors 422 and 424, and observing the resulting noise voltage level at the output of amplifier 320. The values of variable capacitors 422 and 424 can then be chosen as the capacitance values that result in the lowest observed noise voltage level at the output of amplifier 320.

In one embodiment, the capacitance value of variable capacitors 422 and 424 may be programmed via a digital interface and stored in a static random-access memory (SRAM). In other embodiments, variable capacitors 422 and 424 may be one-time programmable (OTP) using fuses that are blown during the manufacturing process. As a result, the programming of the capacitance values could be done by the manufacturer or could be done by the end user as a calibration.

The signals from variable capacitors 422 and 424 are fed to the inverting input 440 of amplifier 420. This causes the output 444 of amplifier 420 to mirror with equal amplitude but opposite phase the sum of the noise from the power supply 306 and analog ground 304 that are being summed at node 340.

In the embodiment shown, there is one dummy channel 400 for each ROIC. As a result, for an ROIC that has 256 channels, the same dummy channel output will be fed to and summed with each of the 256 channels on the ROIC. However, other embodiments may have more dummy channels per analog front end device, depending upon the circuit configuration and system requirements.

By way of illustration and not of limitation, the accompanying figures show specific embodiments in which the subject matter may be practiced. It is noted that arrows at one or both ends of connecting lines are intended to show the general direction of electrical current flow, data flow, logic flow, etc. Connector line arrows are not intended to limit such flows to a particular direction such as to preclude any flow in an opposite direction.

The scope of this disclosure encompasses all changes, substitutions, variations, alterations, and modifications to the example embodiments described or illustrated herein that a person having ordinary skill in the art would comprehend. The scope of this disclosure is not limited to the example embodiments described or illustrated herein. Moreover, although this disclosure describes and illustrates respective embodiments herein as including particular components, elements, feature, functions, operations, or steps, any of these embodiments may include any combination or permutation of any of the components, elements, features, functions, operations, or steps described or illustrated anywhere herein that a person having ordinary skill in the art would comprehend. Furthermore, reference in the appended claims to an apparatus or system or a component of an apparatus or system being adapted to, arranged to, capable of, configured to, enabled to, operable to, or operative to perform a particular function encompasses that apparatus, system, component, whether or not it or that particular function is activated, turned on, or unlocked, as long as that apparatus, system, or component is so adapted, arranged, capable, configured, enabled, operable, or operative.

Additionally, although this disclosure describes or illustrates particular embodiments as providing particular advantages, particular embodiments may provide none, some, or all of these advantages. Moreover, the separation of various system components in the embodiments described above should not be understood as requiring such separation in all embodiments.

What is claimed is:

1. An apparatus comprising:
   a first amplifier having a first amplifier input, a second amplifier input, and a first amplifier output;
     wherein the first amplifier input is coupled to a first ground reference terminal; and
     wherein the second amplifier input is adapted to be coupled to a sensor; and
   a second amplifier having a third amplifier input, a fourth amplifier input, and a second amplifier output;
     wherein the third amplifier input is coupled to the first ground reference terminal;
     wherein the fourth amplifier input is coupled to a power supply terminal through a first variable capacitor and to the second ground reference terminal through a second variable capacitor; and
     wherein the second amplifier output is coupled to the second amplifier input;
   wherein the sensor is adapted to be coupled to a third ground reference terminal, and the first amplifier and second amplifier are coupled to the second ground reference terminal.

2. The apparatus of claim 1, wherein a capacitor is connected between the first amplifier output and the second amplifier input.

3. The apparatus of claim 1, wherein a capacitor is connected between the second amplifier output and the fourth amplifier input.

4. The apparatus of claim 1, wherein a first capacitor is connected between the first amplifier output and the second amplifier input, and a second capacitor is connected between the second amplifier output and the fourth amplifier input.

5. The apparatus of claim 1, wherein the coupling between the second amplifier output and the second amplifier input is through a capacitor.

6. The apparatus of claim 4, wherein the coupling between the second amplifier output and the second amplifier input is through a third capacitor.

7. The apparatus of claim 1, wherein a low pass filter is coupled to the first amplifier output.

8. The apparatus of claim 4, wherein a low pass filter is coupled to the first amplifier output.

9. The apparatus of claim 6, wherein a low pass filter is coupled to the first amplifier output.

10. The apparatus of claim 1, wherein the values of the first variable capacitor and second variable capacitor are adjusted to reduce noise from the power supply terminal and the second ground reference terminal at the first amplifier output.

11. The apparatus of claim 6, wherein the values of the first variable capacitor and second variable capacitor are adjusted to reduce noise from the power supply terminal and the second ground reference terminal at the first amplifier output.

12. An apparatus comprising:
  a first amplifier having first and second amplifier inputs and a first amplifier output;
    wherein the first amplifier input is coupled to a first ground reference terminal;
    wherein the second amplifier input is coupled to a power supply terminal through a first variable capacitor, and coupled to a second ground reference terminal through a second variable capacitor; and
  a second amplifier having third and fourth amplifier inputs and a second amplifier output, wherein the first amplifier output is coupled to the third amplifier input; and
  wherein the first amplifier output is opposite in polarity and has approximately equal amplitude to the sum of the noise capacitively coupled to the second amplifier from the second ground reference terminal and the noise capacitively coupled to the second amplifier from the power supply terminal.

13. The apparatus of claim 12, wherein a capacitor is coupled between the first amplifier output and the second amplifier input.

14. The apparatus of claim 13, wherein the coupling of the first amplifier output to the third amplifier input is through a capacitor.

15. The apparatus of claim 14, further comprising a low pass filter coupled to the second amplifier output.

16. A method for reducing noise comprising:
  coupling a first ground reference terminal to a first input of a first amplifier;
  coupling a power supply terminal to a second input of the first amplifier through a first variable capacitor;
  coupling a second ground reference terminal to the second input of the first amplifier through a second variable capacitor;
  adjusting the capacitance values of the first variable capacitor and the second variable capacitor to reduce noise at an adjustment terminal; and
  coupling an output of the first amplifier to an input of a second amplifier through a capacitor.

17. The method of claim 16, wherein the capacitance values of the first variable capacitor and the second variable capacitor are selected to reduce noise at the input of the second amplifier.

18. The method of claim 17, further comprising coupling a first capacitor between the output of the first amplifier and the second input of the first amplifier, and coupling a second capacitor between an output of the second amplifier and the input of the second amplifier.

19. The method of claim 17, further comprising coupling a low pass filter to the output of the second amplifier.

\* \* \* \* \*